United States Patent
Matano

(10) Patent No.: US 8,134,858 B2
(45) Date of Patent: Mar. 13, 2012

(54) SEMICONDUCTOR DEVICE FOR SUPPLYING STABLE VOLTAGE TO CONTROL ELECTRODE OF TRANSISTOR

(75) Inventor: Tatsuya Matano, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 142 days.

(21) Appl. No.: 12/648,084

(22) Filed: Dec. 28, 2009

(65) Prior Publication Data
US 2010/0165703 A1 Jul. 1, 2010

(30) Foreign Application Priority Data

Dec. 25, 2008 (JP) .................................. 2008-330808

(51) Int. Cl.
*G11C 11/00* (2006.01)
(52) U.S. Cl. ..................... 365/148; 365/189.09; 365/207
(58) Field of Classification Search .................. 365/148, 365/189.09, 207
See application file for complete search history.

(56) References Cited

U.S. PATENT DOCUMENTS
2007/0069802 A1* 3/2007 Choi et al. ..................... 327/536

FOREIGN PATENT DOCUMENTS
| JP | 2003-308126 A | 10/2003 |
| JP | 2005-174351 A | 6/2005 |
| JP | 2008-017203 A | 1/2008 |

* cited by examiner

*Primary Examiner* — Huan Hoang
(74) *Attorney, Agent, or Firm* — Sughrue Mion, PLLC

(57) ABSTRACT

A semiconductor device comprises an internal voltage generator circuit which includes a first transistor having a first and a second main electrode and a control electrode, a control circuit controlling a voltage between the second main electrode and the control electrode of the first transistor such that a voltage at the first main electrode of the first transistor remains at a predetermined voltage, and a second transistor having a first and a second main electrode and a control electrode. A voltage between the second main electrode and the control electrode of the first transistor is applied between the second main electrode and the control electrode of the second transistor.

14 Claims, 7 Drawing Sheets

SEMICONDUCTOR DEVICE FOR SUPPLYING STABLE VOLTAGE TO CONTROL ELECTRODE OF TRANSISTOR

This application is based upon and claims the benefit of priority from Japanese Patent Application No. 2008-330808 filed on Dec. 25, 2008, the content of which is incorporated by reference.

BACKGROUND OF THE INVENTION

1. Field of the Invention

The present invention relates to a semiconductor device.

2. Description of Related Art

In recent years, PRAM (Phase change Random Access Memory) has increasingly gained popularity as one of nonvolatile memories which hold stored data even if they are not supplied with power. The PRAM stores data by using resistance of a phase change material that changes corresponding to a phase change of the phase change material due to the temperature (whether the material is in a crystallized state or an amorphized state).

A phase change film, which is formed of a phase change material such as a compound and that is called a "GST film" which contains germanium (Ge), antimony (Sb), and tellurium (Te), is employed in the PRAM. The phase of the GST film alternates between a non-crystal state and a crystal state, corresponding to Joule heat generated by a current supplied thereto. This phase change causes a change in resistance $R_{GST}$ of the GST film.

In general PRAMs, for changing resistance $R_{GST}$ of a GST film in a memory cell, write circuit YYj is used by being connected to the other circuit through transistors Q10 and Q20 as illustrated in FIG. 1. For reference, in FIG. 1, transistors Q10 and Q20 are P-ch (P channel) transistors, whose carriers are holes.

Controlling write current $I_{WR}$ is performed by changing write current $I_{WR}$ corresponding to gate voltage $V_{REF}$ generated through resistor division of drive voltage $V_{DD}$, which is applied to a gate electrode of transistor Q10 connected to write circuit YYj. In this example, one value from among divided resistance values is selected by inputting a resistance value selection signal (for example, SEL0 is the resistance value selection signal for selecting a predetermined resistance value) to select respective divided resistance values.

In this regard, an internal voltage generator circuit is employed for generating and outputting gate voltage $V_{REF}$, in order to apply gate voltage $V_{REF}$ to the gate electrode of transistor Q10 connected to write circuit YYj. An internal voltage generator circuit utilizing a comparator is also contemplated as such a kind of general internal voltage generator circuit. One example of such internal voltage generator circuits is disclosed in JP-2005-174351A.

In a general technique for controlling the write current, as shown in FIG. 1, a constant voltage generated by the internal voltage generator circuit is used as gate voltage VREF which is applied to the gate electrode of transistor Q10.

When gate voltage $V_{REF}$ applied to the gate electrode is a constant voltage, a problem arises in that the write current flowing from a source electrode to a drain electrode of transistor Q10 is affected by the process employed when transistor Q10 is manufactured, fluctuations in drive voltage $V_{DD}$ for use in the generation of gate voltage $V_{REF}$, and the temperature of transistor Q10.

SUMMARY

In one embodiment, there is provided a semiconductor device that includes an internal voltage generator circuit which includes a first transistor; a control circuit controlling a voltage between the second main electrode and the control electrode of the first transistor such that a voltage at the first main electrode of the first transistor remains at a predetermined voltage; and a second transistor, a voltage between a second main electrode and a control electrode of the first transistor being applied to between a second main electrode and a control electrode of the second transistor.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, a description will be given of a semiconductor device according to one embodiment of the present invention.

First, a characteristic configuration of internal voltage generator circuit 1 contained in the semiconductor device of this embodiment will be described in detail with reference to FIG. 2.

Figure 2:
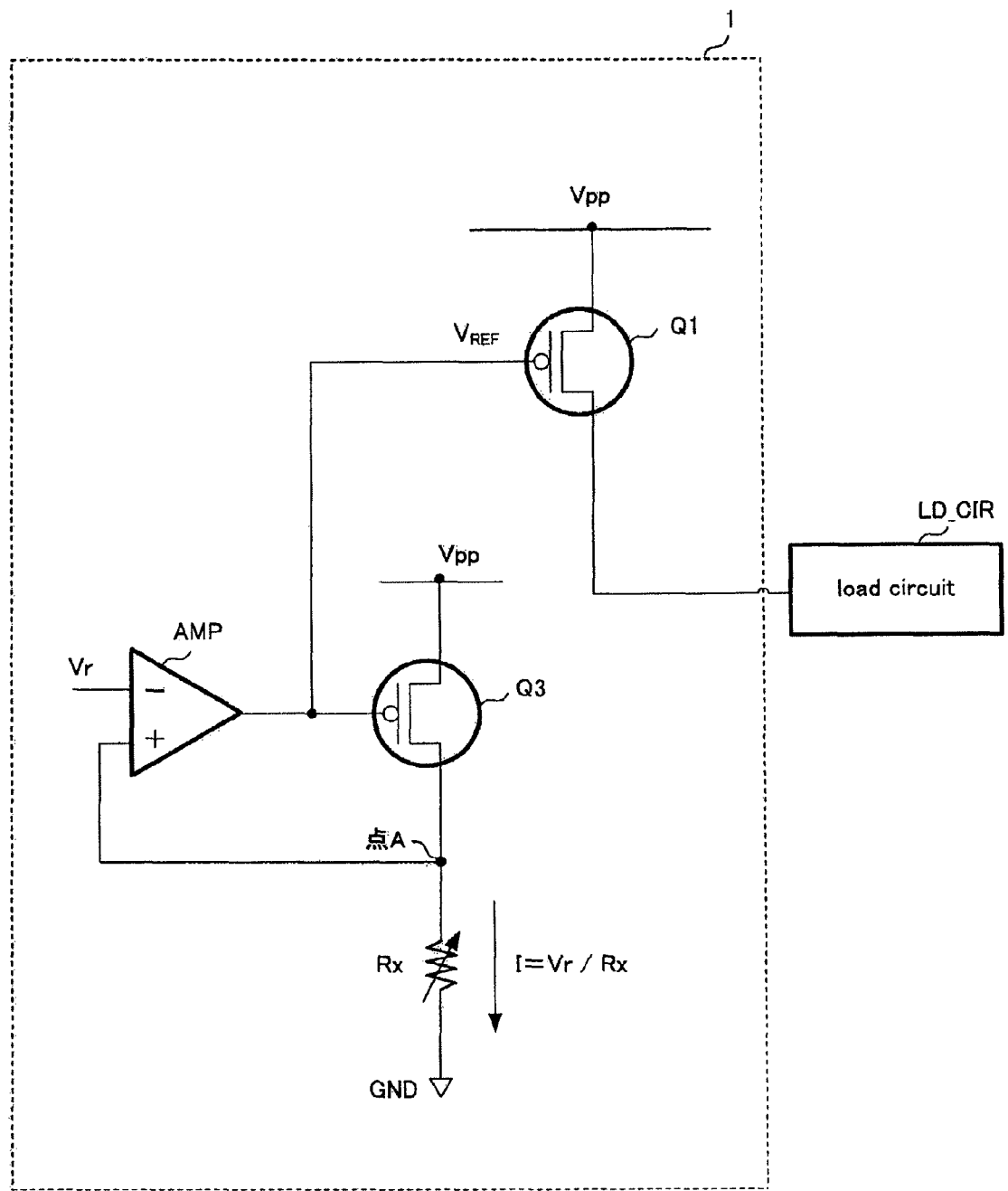
FIG. 2 is a diagram showing a characteristic configuration of an internal voltage generator circuit according to one embodiment of the present invention.

As shown in FIG. 2, internal voltage generator circuit 1 comprises differential amplifier AMP, variable resistor $R_X$, transistor Q1, and transistor Q3. Transistor Q3 corresponds to a "first transistor," while transistor Q1 corresponds to a "second transistor."

In this embodiment, transistor Q3 and transistor Q1 present gate-source voltages Vgs and drain-source voltages Vds which are equal to each other. Also, in this embodiment, transistor Q1 is a transistor which has larger current supply capabilities than current supply capabilities of transistor Q3. Further, in this embodiment, transistors Q3 and Q1 are P-ch (P-channel) transistors.

Transistors Q3 and Q1 have their respective gate electrodes connected to each other and are also connected to an output terminal of differential amplifier AMP. These gate electrodes correspond to "control electrodes."

Transistors Q3 and Q1 have their respective source electrodes applied with voltage Vpp. These source electrodes correspond to "second main electrodes."

Respective drain electrodes of transistors Q3 and Q1 correspond to "first main electrodes." In the following, the gate electrode, source electrode, and drain electrode are simply called the "gate," "source," and "drain," respectively.

The drain of transistor Q3 is connected to a positive input terminal of differential amplifier AMP and to variable resistor $R_X$ at point A.

Also, transistor Q1 has its drain connected to load circuit LD_CIR to supply load circuit LD_CIR with a voltage which is reduced from voltage Vpp in accordance with the value of gate voltage $V_{REF}$ applied from differential amplifier AMP to the gate of transistor Q1.

Differential amplifier AMP is, for example, a differential amplifier. Reference voltage Vr is applied to a negative input terminal of differential amplifier AMP. Also, a voltage at point A, generated at the drain of transistor Q3, is applied to the positive input terminal of differential amplifier AMP.

Differential amplifier AMP is a "control circuit" for amplifying the difference between reference voltage Vr and the voltage at point A, generated at the drain of transistor Q3, to generate gate voltage $V_{REF}$. Then, differential amplifier AMP applies the same gate voltage $V_{REF}$ to the respective gates of transistors Q1 and Q3. In this embodiment, since the same voltage Vpp is applied to the respective sources of transistors Q3 and Q1, transistor Q1 is biased with a voltage between the gate and the source thereof, which is the same voltage as that applied between the gate and the source of transistor Q3.

Also, differential amplifier AMP presents a large voltage amplification characteristic. Thus, differential amplifier AMP controls transistor Q3 so as to hold a voltage generated at the drain of transistor Q3 at a "predetermined voltage." In this embodiment, differential amplifier AMP controls transistor Q3 such that the voltage generated at the drain of transistor Q3 is maintained at reference voltage Vr.

Also, since differential amplifier AMP presents a very large input impedance, current flowing into the positive input terminal of differential amplifier AMP can be neglected. As such, no current substantially flows between the positive input terminal of differential amplifier AMP and point A, so that current flowing from the source to the drain of transistor Q3 is the same as current I which flows through variable resistor $R_X$. When the voltage at point A is the same as reference voltage Vr, current $I=Vr/R_X$ flows through variable resistor $R_X$.

Variable resistor $R_X$ is configured to vary the value of resistance $R_X$. Variable resistor $R_X$ has one terminal connected to point A and the other terminal to the ground.

The semiconductor device of this embodiment comprises an internal voltage generator circuit which includes a first transistor having a first and a second main electrode and a control electrode; a control circuit for controlling voltage between the second main electrode and the control electrode of the first transistor such that voltage at the first main electrode of the first transistor remains at a predetermined voltage; and a second transistor having a first and a second main electrode and a control electrode. The second transistor is biased with a voltage between the second main electrode and the control electrode thereof, which is the same voltage as that applied between the second main electrode and the control electrode of the first transistor.

With the configuration as described above, an internal voltage in accordance with a constant current can be supplied to the second transistor for controlling a write current to a memory cell which is not affected by the process that is used for manufacturing transistors, by fluctuations in the drive voltage for generating gate voltage and by the temperature of the transistors.

Figure 3:
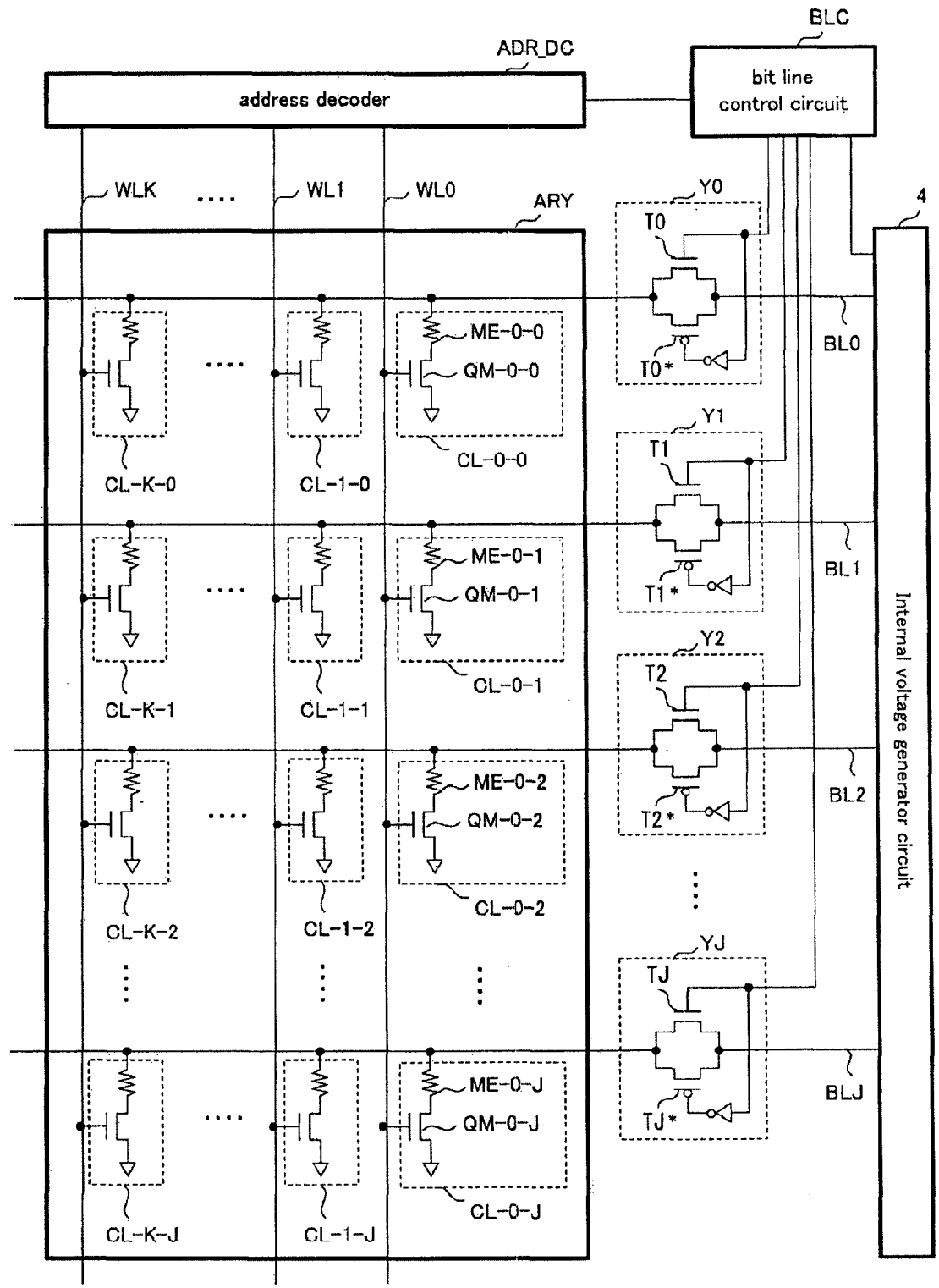
FIG. 3 is a diagram showing an example in which the internal voltage generator circuit shown in FIG. 2 is connected to a memory cell array of a phase change memory and a write circuit.

Referring next to FIG. 3, a description will be given of an example in which internal voltage generator circuit 1 shown in FIG. 2 is connected to memory cell array ARY of a phase change memory (PRAM) through write circuits Yj (j=0-J).

Memory cell array ARY shown in FIG. 3 comprises a plurality of memory cells CL-0-0-CL-K-J arranged to form a lattice. In the following, memory cell CL-k-j in memory cell array ARY represents a memory cell which is at a k-the position (k=0-K) from the right end in the horizontal direction, and at a j-the position (j=0-J) from the top end in the vertical direction. The quantity of these memory cells may be arbitrary. Also, on memory cell array ARY, all memory cells may be divided into a plurality of sets (so-called "banks").

Each memory cell CL-k-j comprises storage element ME-k-j and memory cell transistor QM-k-j. In this embodiment, memory cell transistor QM-k-j is an N-ch (N-channel) transistor, the carriers of which are electrons.

Storage element ME-k-j has one terminal connected to bit line BLj and the other terminal connected to a drain of memory cell transistor QM-k-j. Memory cell transistor QM-k-j, in turn, has a gate connected to word line WLk and a source to the ground.

In this embodiment, each storage element ME-k-j includes a GST film with resistance $R_{GST}$ which varies depending on the temperature. The phase of this GST film changes to either an amorphized state or to a crystallized state corresponding to a temperature which is determined by write current generated from voltage applied from write circuit Yj and supplied thereto through bit line BLj. When the phase of the GST film is in the amorphized state, resistance $R_{GST}$ is higher than that in the crystallized state. When the phase of the GST film changes into the crystallized state, resistance $R_{GST}$ becomes lower, as compared with that in the amorphized state.

When the GST film is amorphized, storage element ME-k-j stores information representative of High level. This storage state is a so-called reset state. On the other hand, when the GST film is crystallized, storage element ME-k-j stores information representative of Low level. This storage state is a so-called set state.

Each word line WLk (k=0-K) is assigned a row address for specifying memory cells CL-k-0-CL-k-J arranged in each row. Each bit line BLj (j=0-J) in turn is assigned a column address for specifying a memory cell arranged in each column. In this embodiment, the row address is the same as order number k counted from the right end of word line WLk, and the column address is the same as order number j counted from the top end of bit line BLj.

Address decoder ADR_DC outputs word selection signal WSELk (k=0-K) to word line WLk for controlling whether or not word line WLk should be selected. Address decoder ADR_DC continues to output word selection signal WSELk at Low level to word line WLk while word line WLk is not selected.

Upon receipt of a row address and a column address, address decoder ADR_DC decodes the row address and column address, and outputs the decoded column address to bit line control circuit BLC. Also, in this event, address decoder ADR_DC transitions word selection signal WSELk from Low to High, and outputs word selection signal WSELk at High level to word line WLk corresponding to the input row address. Word selection signal WSELk at High level acts to simultaneously turn on memory cell transistors QM-k-0-QM-k-J which have the gates connected to word line WLk to which word selection signal WSELk at High level has been output.

In this embodiment, the row address and column address are input to address decoder ADR_DC when bit line control circuit BLC receives active command ACT for starting to write or to read information into or from storage element ME-k-j.

Bit line control circuit BLC is responsible for controlling the operation of each write circuit Yj and for controlling the supply of a write current from internal voltage generator circuit 4 to storage element ME-k-j.

Bit line control circuit BLC outputs bit selection signal BSELj (j=0-J) to write circuit Yj for controlling whether or not bit line BLj should be selected. Bit line control circuit BLC continues to output bit selection signal BSELj at Low level to write circuit Yj while bit line BLJ is not selected.

Also, upon receipt of write command WRITE for instructing a write operation of information into a storage element and a column address from address decoder ADR_DC, bit line control circuit BLC transitions bit selection signal BSELj from Low to High, and outputs bit selection signal BSELj at High level to write circuit Yj connected to bit line BLj corresponding to the input column address. In this embodiment, while memory cell transistors QM-k-0-QM-k-J remain on with word selection signal WSELk at High level, bit line control circuit BLC outputs bit selection signal BSELj at High level to write circuit Yj. This results in the selection of one particular memory cell CL-k-j connected to word line WLk and bit line BLj, so that this memory cell CL_k_j can be supplied with a write current.

In this regard, as long as one particular memory cell CL-k-j is definitely selected before the write current is supplied, no particular limitations are imposed on the order or timing of outputting word selection signal WSELk and bit selection signal BSELj.

Bit line control circuit BLC also outputs reset operation signal $V_{RESET}$ to internal voltage generator circuit 1 for controlling whether or not information representative of High level should be written into storage element ME-k-j. Bit line control circuit BLC outputs reset operation signal $V_{RESET}$ at High level while it is not applied with write command WRITE for instructing a write operation of information representative of High level into storage element ME-k-j. Also, upon receipt of write command WRITE for instructing a write operation of information representative of High level into storage element ME-k-j, bit line control circuit BLC outputs reset operation signal $V_{RESET}$ at Low level for time period t1.

Bit line control circuit BLC also outputs set operation signal $V_{SET}$ to internal voltage generator circuit 1 for controlling whether or not information representative of Low level should be written into storage element ME-k-j. Bit line control circuit BLC outputs set operation signal $V_{SET}$ at High level while it is not applied with write command WRITE for instructing a write operation of information representative of Low level into storage element ME-k-j. Also, upon receipt of write command WRITE for instructing a write operation of information representative of Low level into storage device ME-k-j, bit line control circuit BLC outputs set operation signal $V_{SET}$ at Low level for time period t2.

Figure 1:
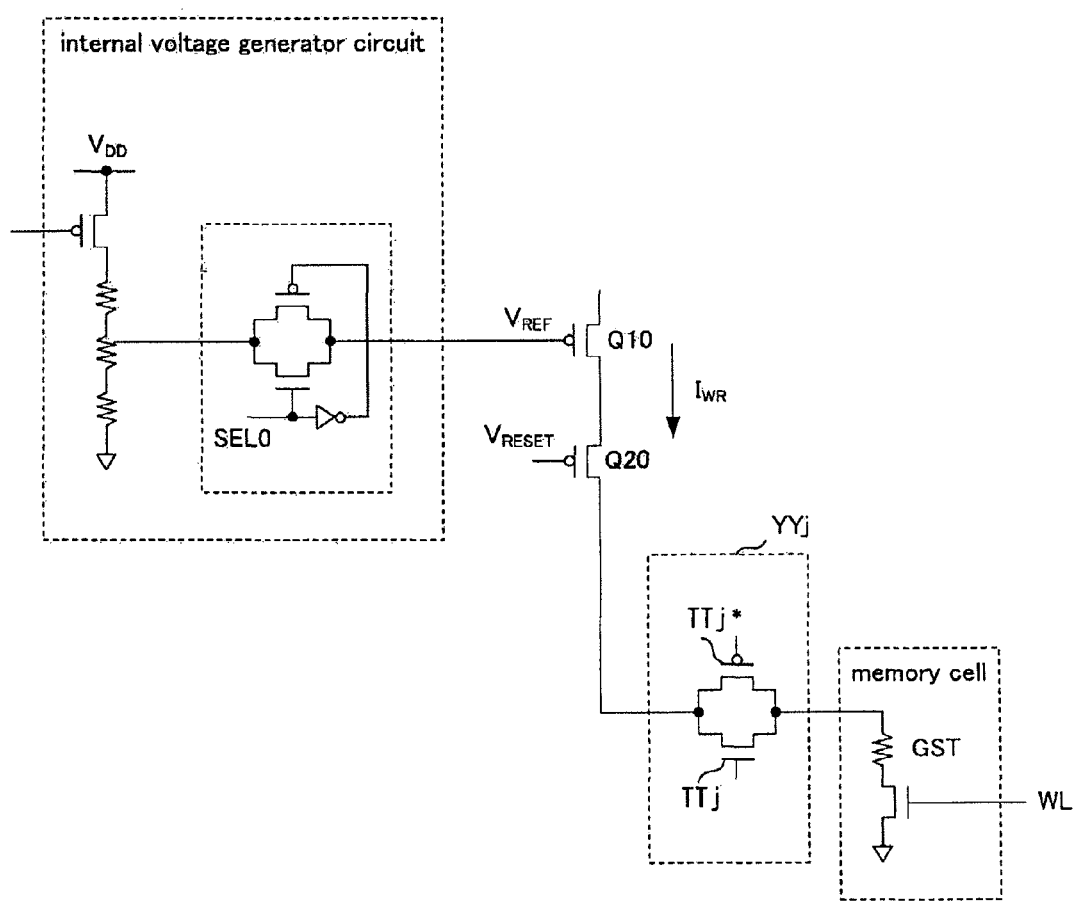
FIG. 1 is a diagram showing the configuration of a general internal voltage generator circuit for applying a gate voltage to a write current control transistor for supplying a write current to a storage element within a phase change memory.

Each write circuit Yj (j=0-J) is connected to each bit line BLj in one-to-one correspondence. The configuration of write circuit Yj is not particularly limited. In this embodiment, write circuit Yj comprises N-ch transistor Tj (j=0-J), similar to general write circuit YYj shown in FIG. 1, a transfer gate including P-ch transistor Tj* (j=0-J), and an inverter circuit.

Transistor Tj receives, at its gate, bit selection signal BSELj from bit line control circuit BLC to control a connection (make conductive or non-conductive) of bit line BLj with storage element ME-k-j. Upon receipt of bit selection signal BSELj at High level, transistor Tj makes conductive a connection of bit line BLj with storage element ME-k-j connected with memory cell transistor QM-k-j among those QM-k-0-QM-k-J which have been turned on by word selection signal WSELk at High level. On the other hand, upon receipt of bit selection signal BSELj at Low level, transistor Tj makes non-conductive the connection of bit line BLj with storage element ME-k-j.

The inverter circuit receives bit selection signal BSELj from bit line control circuit BLC, inverts bit selection signal BSELj from High level to Low level or vice versa to generate signal BSELBj which is then output to transistor Tj*.

Transistor Tj* receives signal BSELBj from the inverter circuit at its gate to control a connection of bit line BLj with storage element ME-k-j (make conductive or non-conductive). Upon receipt of signal BSELBj at Low level, transistor Tj* makes conductive a connection of bit line BLj with storage element ME-k-j connected to memory cell transistor QM-k-j among those QM-k-0-QM-k-J which have been turned on by word selection signal WSELk at High level. On the other hand, upon receipt of signal BSELBj at High level, transistor Tj* makes non-conductive the connection of bit line BLj with storage element ME-k-j.

While transistors Tj and Tj* make conductive a connection of one particular storage element ME-k-j with bit line BLj, internal voltage generator circuit 4 applies a write voltage to that storage element, causing a write current for writing information representative of High or Low level to be supplied to that storage element ME-k-j through bit line BLj. In this way, storage element ME-k-j is placed into a reset state or a set state.

Figure 4:
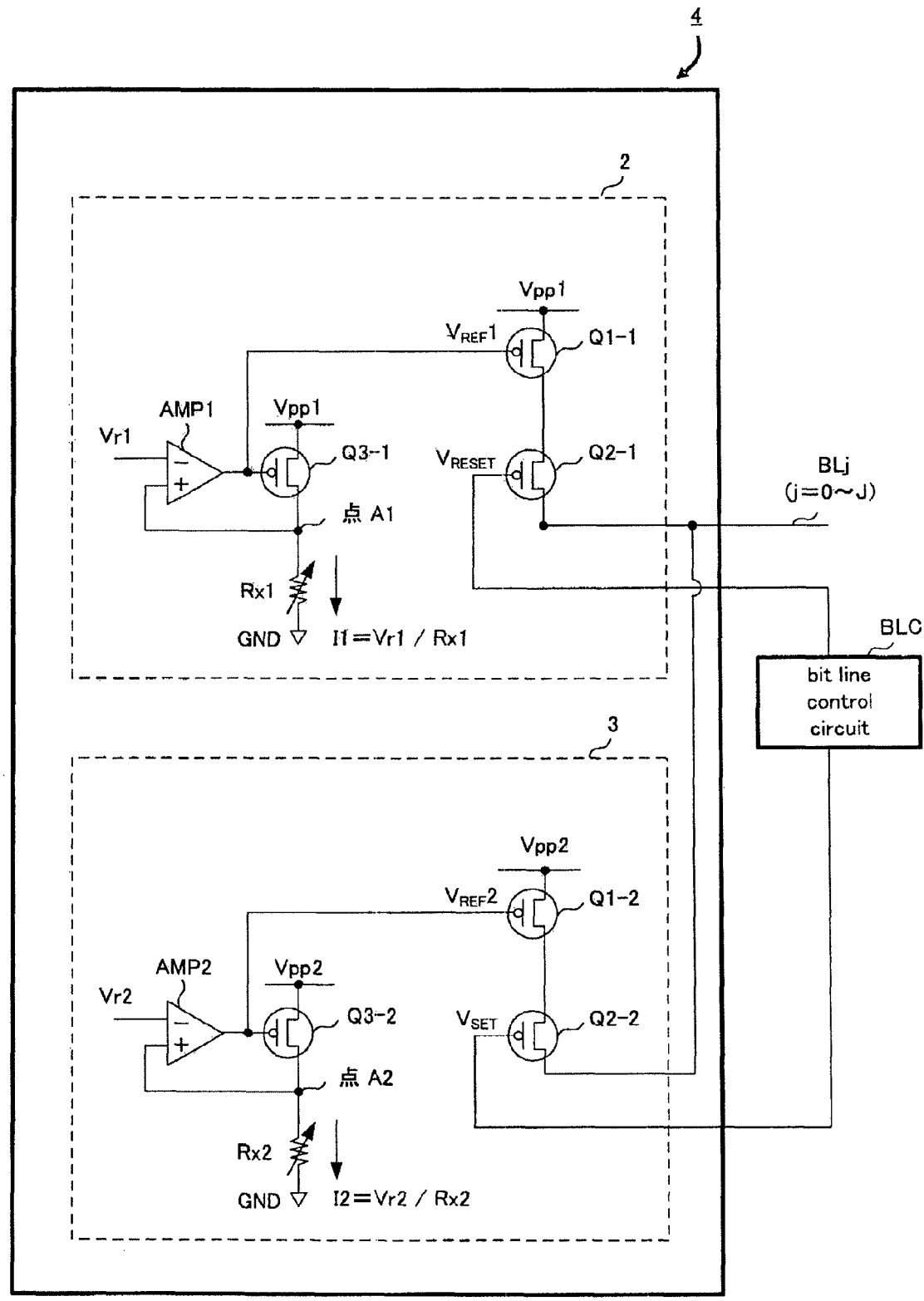
FIG. 4 is a diagram showing the configuration of the internal voltage generator circuit shown in FIG. 3.

Referring next to FIG. 4, a description will be given of an example of a specific circuit configuration for internal voltage generator circuit 4 shown in FIG. 3.

As shown in FIG. 4, internal voltage generator circuit 4 comprises "first internal voltage generator circuit 2" and "second internal voltage generator circuit 3," each including the configuration shown in FIG. 2.

First internal voltage generator circuit 2 is provided to place each storage element ME-k-j into a reset state, while second internal voltage generator circuit 3 is provided to place each storage element ME-k-j into a set state.

"First internal voltage generator circuit 2" comprises transistor Q1-1, reset control transistor Q2-1 (hereinafter simply called "transistor Q2-1"), transistor Q3-1, differential amplifier AMP1, and variable resistor $R_X1$. Transistor Q3-1 is a "first transistor included in the first internal voltage generator circuit," while transistor Q1-1 is a "second transistor included in the first internal voltage generator circuit." Differential amplifier AMP1 is a "control circuit included in the first internal voltage generator circuit."

"Second internal voltage generator circuit 3" comprises transistor Q1-2, set control transistor Q2-2 (hereinafter simply called "transistor Q2-2"), transistor Q3-2, differential amplifier AMP2, and variable resistor $R_X2$. Transistor Q3-2 is a "first transistor included in the second internal voltage generator circuit," while transistor Q1-2 is a "second transistor included in the second internal voltage generator circuit."

Differential amplifier AMP2 is a "control circuit included in the second internal voltage generator circuit."

Reset control transistor Q2-1 and set control transistor Q2-2 are "switches." In this embodiment, transistors Q2-1 and Q2-2 are P-ch transistors. Respective gates of transistors Q1-1, Q1-2, Q2-1, Q2-2, Q3-1, and Q3-2 are "control electrodes," respective drains thereof are "first main electrodes," and respective sources thereof are "second main electrodes."

In the following, first internal voltage generator circuit 2 will be described.

In this embodiment, transistors Q3-1 and Q1-1 present gate-source voltages Vgs and drain-source voltage Vds equal to each other. Also, in this embodiment, transistor Q1-1 has current supply capabilities larger than current supply capabilities of transistor Q3-1.

Transistors Q3-1 and Q1-1 have their gates connected to each other and also connected to an output terminal of differential amplifier AMP1. Voltage Vpp1 is applied to respective sources of transistors Q3-1 and Q1-1. Also, transistor Q3-1 has a drain connected to a positive input terminal of differential amplifier AMP1 and to variable resistor $R_X1$ at point A1.

Differential amplifier AMP1 is applied with reference voltage Vr1 at a negative input terminal, and with a voltage at point A1, generated at the drain of transistor Q3-1 at the positive input terminal. Differential amplifier AMP1 amplifiers the difference between reference voltage Vr1 and the voltage generated at the drain of transistor Q3-1 to generate gate voltage $V_{REF}1$, and applies the same gate voltage $V_{REF}1$ to the respective gates of transistor Q3-1 and Q1-1. In this embodiment, since the same voltage Vpp1 is applied to the respective sources of transistors Q3-1 and Q1-1, transistor Q1-1 is biased with a voltage between the gate and the source thereof, which is the same voltage as that applied between the gate and the source of transistor Q3-1.

Also, differential amplifier AMP1 controls transistor Q3-1 such that the voltage generated at the drain of transistor Q3-1 is held at a "predetermined first voltage." In this embodiment, differential amplifier AMP1 controls transistor Q3-1 such that the voltage generated at the drain of transistor Q3-1 is maintained at reference voltage Vr1.

Also, no current substantially flows between the positive input terminal of differential amplifier AMP1 and point A1, so that a current flowing from the source to the drain of transistor Q3-1 is the same as current I1 which flows through variable resistor $R_X1$. When the voltage at point A1 is the same as reference voltage Vr1, current $I1=Vr1/R_X1$ flows through variable resistor $R_X1$.

Variable resistor $R_X1$ is a "variable resistor included in the first internal voltage generator circuit" which has one terminal connected to point A1 and the other terminal to the ground.

In this embodiment, reference voltage Vr1 and resistance value RX1 of variable resistor RX1 have been previously set to suitable values for placing storage element ME-k-j into a reset state by the action of a write current flowing through transistor Q1-1 when voltage Vpp1 is applied.

Transistor Q2-1 has the source connected to the drain of transistor Q1-1, and transistor Q2-1 has the drain connected to storage element ME-k-j through bit line BLj.

Transistor Q2-1 is a "first switch" for controlling whether or not voltage Vpp1 applied to the source of transistor Q1-1 should be supplied to write circuit Yj corresponding to reset operation signal $V_{RESET}$ applied to the gate of transistor Q2-1 from bit line control circuit BLC. Transistor Q2-1 remains off when it is receiving reset operation signal $V_{RESET}$ at High level.

Transistor Q2-1 remains on for time period t1 while it is receiving reset operation signal $V_{RESET}$ at Low level to conductively connect its gate and drain.

Consequently, storage element ME-k-j is applied with write pulse PL1 which has voltage V1, reduced from voltage Vpp1 in accordance with the value of gate voltage $V_{REF}1$ applied to the gate of transistor Q1-1, and which has time width t1. Storage element ME-k-j is amorphized by a write current which flows in accordance with voltage V1 and resistance $R_{GST}$ of the GST film in storage element ME-k-j, placing storage element ME-k-1 into a reset state. Write pulse signal PL1 is a "first write voltage," and reset operation signal $V_{RESET}$ at Low level is a "reset operation voltage."

Next, second internal voltage generator circuit 3 will be described.

In this embodiment, transistors Q3-2 and Q1-2 present gate-source voltages Vgs and drain-source voltages Vds equal to each other. Also, in this embodiment, transistor Q1-2 has current supply capabilities larger than the current supply capabilities of transistor Q3-2.

Transistors Q3-2 and Q1-2 have their gates connected to each other, and also connected to an output terminal of differential amplifier AMP2.

Voltage Vpp2 is applied to respective sources of transistors Q3-2 and Q1-2. Notably, smaller write current is required when it is supplied to place a storage element into a set state than when it is supplied to place a storage element into a reset state. Accordingly, voltage Vpp2 applied to the source of transistor Q1-2 may be a voltage lower than voltage Vpp1 applied to the source of transistor Q1-1.

Transistor Q3-2 has the drain connected to a positive input terminal of differential amplifier AMP2 and variable resistor RX2 at point A2.

Differential amplifier AMP2 is applied with reference voltage Vr2 at a negative input terminal and with a voltage at point A2, generated at the drain of transistor Q3-2 at the positive input terminal. Differential amplifier AMP2 amplifies the difference between reference voltage Vr2 and the voltage generated at the drain of transistor Q3-2 to generate gate voltage $V_{REF}2$, and supplies the same gate voltage $V_{REF}2$ to the respective gates of transistors Q3-2 and Q1-2. In this embodiment, since the same voltage Vpp2 is also applied to the respective sources of transistors Q3-2 and Q1-2, transistor Q1-2 is biased with a voltage between the gate and the source thereof, which is the same voltage as that applied between the gate and the source of transistor Q3-2.

Also, differential amplifier AMP2 controls transistor Q3-2 such that the voltage generated at the drain of transistor Q3-2 is held at a "predetermined second voltage." In this embodiment, differential amplifier AMP2 controls transistor Q3-2 such that the voltage generated at the drain of transistor Q3-2 is maintained at reference voltage Vr2.

Also, no current substantially flows between the positive input terminal of differential amplifier AMP2 and point A2, so that a current flowing from the source to the drain of transistor Q3-2 is the same as current I2 which flows through variable resistor $R_X2$. When the voltage at point A2 is the same as reference voltage Vr2, current $I2=Vr2/R_X2$ flows through variable resistor $R_X2$.

Variable resistor $R_X2$ is a "variable resistor included in the second internal voltage generator circuit" which has one terminal connected to point A2 and the other terminal to the ground.

In this embodiment, reference voltage Vr2 and resistance value RX2 of variable resistor RX2 have been previously set to suitable values for placing storage element ME-k-j into a set state by the action of a write current flowing through transistor Q1-2 when voltage Vpp2 is applied.

Notably, smaller write current is required when it is supplied to place a storage element into a set state than when it is supplied to place a storage element into a reset state. Accordingly, a current (current $I1=Vr1/R_X1$) flowing from the source to the drain of transistor Q3-1 is made larger than a current (current $I2=Vr2/R_X2$) flowing from the source to the drain of transistor Q3-2. Thus, when resistance RX2 of variable resistor RX2 is the same as resistance RX1 of variable resistor RX1, reference voltage Vr2 maintained as the "predetermined second voltage" at the drain of transistor Q3-2 by differential amplifier AMP2 may be lower than reference voltage Vr1 maintained as the "first predetermined voltage" at the drain of transistor Q3-1 by differential amplifier AMP1.

Transistor Q2-2 has its source connected to the drain of transistor Q1-2, and its drain connected to storage element ME-k-j through bit line BLj.

Transistor Q2-2 is a "second switch" for controlling whether or not voltage Vpp2 applied to transistor Q1-2 should be supplied to write circuit Yj corresponding to set operation signal $V_{SET}$ applied to the gate thereof from bit line control circuit BLC. Transistor Q2-2 remains off while it is receiving set operation signal $V_{SET}$ at High level.

Transistor Q2-2 remains on for time period t2, while it is receiving set operation signal $V_{SET}$ at Low level, to conductively connect its source and drain.

Consequently, storage element ME-k-j is applied with write pulse PL2 which has voltage V2, reduced from voltage Vpp2 in accordance with the value of gate voltage $V_{REF}2$ applied to the gate of transistor Q1-2, and which has time width t2. Storage element ME-k-j is crystallized by a write current which flows in accordance with voltage V2 and resistance $R_{GST}$ of the GST film in storage element ME-k-j, placing storage element ME-k-1 into a set state. Write pulse signal PL2 is a "second write voltage," and set operation signal $V_{SET}$ at Low level is a "set operation voltage."

Figure 5:
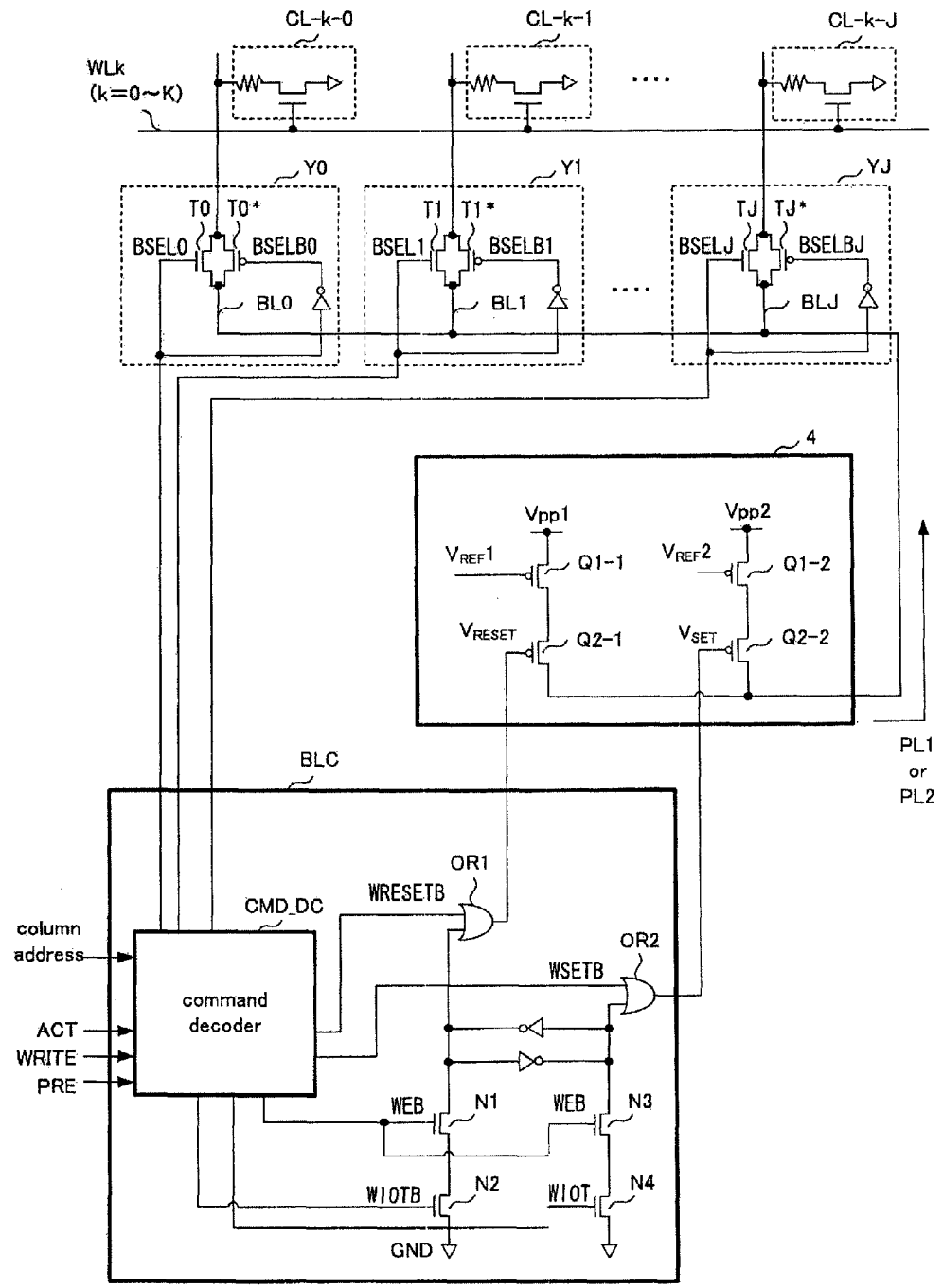
FIG. 5 is a diagram showing an exemplary topology among an internal voltage generator circuit, a write circuit, and a bit line control circuit.

Referring next to FIG. 5, a description will be given of a manner in which transistors Q2-1 and Q2-2 within internal voltage generator circuit 4 are connected with each write circuit Yj and bit line control circuit BLC, as well as the internal configuration of bit line control circuit BLC.

Bit line control circuit BLC comprises command decoder CMD_DC, two-input OR circuit OR1 (hereinafter simply called "OR circuit OR1"), two-input OR circuit OR2 (hereinafter simply called "OR circuit OR2"), transistors N1, N2, N3, N4, and two invertor circuits. In this embodiment, transistors N1-N4 are N-ch transistors.

OR circuit OR1 receives signal WRESETB at one of two input terminals, and has the other input terminal grounded through two transistors N1 and N2 connected in series and its output terminal connected to the gate of reset control transistor Q2-1.

OR circuit OR2 receives signal WSETB at one of two input terminals, and has the other input terminal grounded through two transistors N3 and N4 connected in series, and its output terminal connected to the gate of set control transistor Q2-2.

Command decoder CMD_DC is connected to each write circuit Yj, address decoder ADR_DC shown in FIG. 3, OR circuit OR1, OR circuit OR2, and transistors N1-N4.

Command decoder CMD_DC receives an input command for instructing an arbitrary operation such as a write operation, a read operation and the like of information into and from storage element ME-k-j, and controls the operation of each write circuit Yj, OR circuits OR1 and OR2, and transistors N1-N4 for implementing an operation in accordance with such a command.

Command decoder CMD_DC receives input active command ACT. Active command ACT is a command for specifying (latching) a row address of one particular word line WLk for selecting storage elements ME-k-0-ME-k-J of one row connected to that word line WLk. Notably, when active command ACT is applied, address decoder ADR_DC shown in FIG. 3 receives and decodes a row address and a column address, outputs the column address to command decoder CMD_DC, and outputs word selection signal WSELk at High level to word line WLk corresponding to the row address.

Upon receipt of write command WRITE and the column address from address decoder ADR_DC, command decoder CMD_DC transitions bit selection signal BSELj from Low to High, and outputs bit selection signal BSELj at High level to write circuit Yj connected to bit line BLj corresponding to the received column address. Write command WRITE is a command for instructing a write operation of information into storage element ME-k-j and specifying (latching) the column address.

In this embodiment, command data CMD_DC outputs signal WIOTB at Low level to the gate of transistor N2 and outputs signal WIOT at High level to the gate of transistor N4 during the period when it is not receiving input write command WRITE for instructing a write operation of information representative of High level. Signal WIOTB is a signal for controlling whether to permit or prohibit a write operation of information representative of High level. Signal WIOT is a signal generated by inverting signal WIOTB from High to Low or vice versa for controlling whether to permit or prohibit a write operation of information representative of Low level.

Also, upon receipt of input write command WRITE for instructing a write operation of information representative of High level, command decoder CMD_DC transitions signal WIOTB from Low to High and outputs the resulting WIOTB signal to the gate of transistor N2 for a certain period, and transitions signal WIOT from High to Low and outputs the resulting signal WIOT to the gate of transistor N4 for the certain period. In this event, command decoder CMD_DC transitions signal WIOTB from High to Low and signal WIOT from Low to High after the certain period has elapsed from the time at which it received write command WRITE.

Command decoder CMD_DC also outputs write control signal WEB for controlling permission or prohibition of a write operation to the respective gates of transistors N1 and N3. Command decoder CMD_DC outputs write control signal WEB at Low level during a write operation is prohibited.

Also, command decoder CMD_DC, after receiving write command WRITE, transitions write control signal WEB from Low to High, and outputs write control signal WEB at High level to the respective gates of transistors N1 and N3 for a predetermined time period. When this predetermined time period has elapsed, command decoder CMD_DC transitions write control signal WEB from High to Low.

Command decoder CMD_DC also outputs signal WRESETB to OR circuit OR1. Command decoder CMD_DC outputs signal WRESETB at High level while information representative of High level is not written. On the other hand, when command decoder CMD_DC transitions signal WIOTB from High to Low and signal WIOT from Low to High by the receipt of an input for instructing a write operation of information representative of High level, command decoder CMD_DC transitions signal WRESETB from high to Low, and outputs the resulting signal WRESETB to OR circuit OR1 for time period t1.

Command decoder CMD_DC also outputs signal WSETB to OR circuit OR2. Command decoder CMD_DC outputs signal WSETB at High level during the period when information representative of Low level is not written. On the other hand, after command decoder CMD_DC outputs write control signal WEB at High level by the receipt of an input for instructing a write operation of information representative of Low level, command decoder CMD_DC transitions signal WSETB from High to Low, and outputs the resulting signal WSETB to OR circuit OR2 for time period t2.

Also, upon receipt of input precharge command PRE, command decoder CMD_DC transitions bit selection signal BSELj from High to Low, and outputs bit selection signal BSELj at Low level to write circuit Yj. Precharge command PRE is a command for instructing that specifying a selected row address be stopped and that a precharge be performed. Also, upon receipt of precharge command PRE, command decoder CMD_DC notifies address decoder ADR_DC shown in FIG. 3 to that effect. Upon notification of precharge command PRE received by command decoder CMD_DC, address decoder ADR_DC transitions word selection signal WSELk from High to Low.

Figure 6:
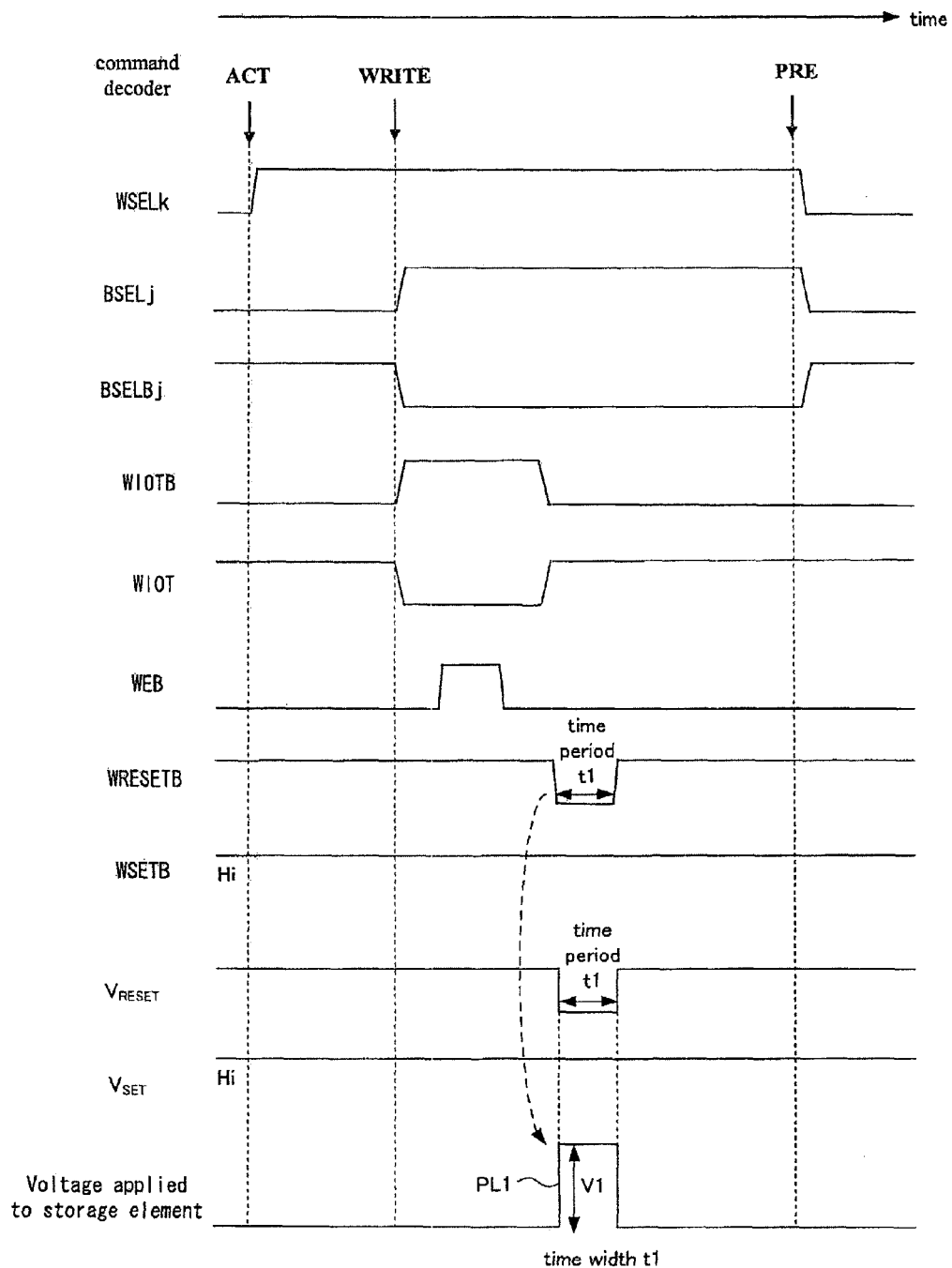
FIG. 6 is a diagram showing an exemplary timing chart of respective signals output from respective components of the bit line control circuit and the internal voltage generator circuit when a storage element is placed into a reset state.

Referring next to FIG. 6, a description will be given of operations performed when storage element ME-k-j is placed into a "reset state." FIG. 6 is a timing chart of respective signals output from respective components of bit line control circuit BLC and internal voltage generator circuit 4 when storage element ME-k-j is placed into a "reset state."

As shown in FIG. 6, command decoder CMD_DC first receives input active command ACT.

On the other hand, when active command ACT is input, address decoder ADR_DC receives and decodes a row address and a column address, outputs the column address to command decoder CMD_DC, and outputs word selection signal WSELk at High level, transitioned from Low level, to word line WLk corresponding to the row address. In this event, word selection signal WSELk at High level acts to simultaneously turn on memory cell transistors QM-k-0-QM-k-J which have the gates connected to word line WLk to which word selection signal WSELk at High level has been output.

Subsequently, upon receipt of write command WRITE and the column address from address decoder ADR_DC, command decoder CMD_DC transitions bit selection signal BSELj from Low to High, and outputs bit selection signal BSELj at High level to write circuit Yj connected to bit line BLj corresponding to the received column address. In this event, transistor Tj within write circuit Yj receives that bit selection signal BSELj at High level at its gate to make conductive a connection of internal voltage generator circuit 4 with bit line BLj. Also, the inverter circuit within write circuit Yj inverts the level of bit selection signal BSELj from High to Low to generate signal BSELBj which is output to the gate of transistor Tj*. Consequently, transistor Tj* also makes conductive a connection of internal voltage generator circuit 4 with bit line BLj.

Also, upon receipt of input write command WRITE for instructing a write operation of information representative of High level, command decoder CMD_DC transitions signal WIOTB from Low to High and outputs the resulting signal WIOTB to the gate of transistor N2 for a certain period, and transitions signal WIOT from High to Low and outputs the resulting signal WIOT to the gate of transistor N4 for the certain period.

Further, command decoder CMD_DC transitions write control signal WEB from Low to High for a certain period during which it is outputting signal WIOTB at High level and signal WIOT at Low level, and outputs write control signal WEB at High level to the respective gates of transistors N1 and N3 for a predetermined time period.

Consequently, in correspondence to the transition of signal WIOTB from Low to High and the transition of write control signal WEB from Low to High, two transistors N1 and N2 that are connected in series, receive signals WIOTB and WEB, respectively, at their gates, and are both placed into ON state. In this event, one input terminal of OR circuit OR1, which is applied with signal WRESETB, goes Low, while one input terminal of OR circuit OR2, which is applied with signal WSETB, goes High. Subsequently, even when command decoder CMD_DC transitions write control signal WEB from High to Low due to the lapse of the predetermined time period, the information is still held in the latch circuit. Notably, when a certain period is elapsed from the time when write command WRITE is applied, command decoder CMD_DC transitions signal WIOTB from High to Low and signal WIOT from Low to High.

In the state described above, when command decoder CMD_DC transitions signal WIOTB from High to Low and signal WIOT from Low to High, command decoder CMD_DC transitions signal WRESETB from High to Low, and outputs the resulting WRESETB to OR circuit OR1 for time period t1.

Upon receipt of Low signals from the two input terminals, OR circuit OR1 transitions reset operation signal $V_{RESET}$ on the output side from High to Low, and applies reset operation signal $V_{RESET}$ at Low level to the gate of transistor Q2-1 for time period t1.

Transistor Q2-1 remains on while it is receiving reset operation signal $V_{RESET}$ at Low level for time period t1, to conductively connect the source and the drain. Consequently, storage element ME-k-j is applied with write pulse PL1 which has voltage V1, reduced from voltage Vpp1 in accordance with the value of gate voltage $V_{REF}1$ applied to the gate of transistor Q1-1, and time width t1. Storage element ME-k-j is amorphized by a write current which flows in accordance with voltage V1 and resistance $R_{GST}$ of the GST film in storage element ME-k-j, placing storage element ME-k-j into a reset state.

Notably, for time period t1 during which signal WRESETB at Low level is output, OR circuit OR2 receives a High level from one input terminal, so that set operation signal $V_{SET}$ output from OR circuit OR2 remains fixed at High level irrespective of the potential of signal WSETB.

Subsequently, upon receipt of precharge command PRE, command decoder CMD_DC transitions bit selection signal BSELj from High to Low, and outputs bit selection signal BSELj at Low level to write circuit Yj. Then, write circuit Yj makes non-conductive the connection of bit line BLj with internal voltage generator circuit 4.

Also, upon receipt of precharge command PRE, command decoder CMD_DC notifies address decoder ADR_DC to that effect. Upon notification of precharge command PRE received by command decoder CMD_DC, address decoder ADR_DC transitions word selection signal WSELk from High to Low. Word selection signal WSELk at Low level acts to simultaneously turn off memory cell transistors QM-k-0-QM-k-J which have the gates connected to word line WLk to which word selection signal WSELk at Low level has been output.

Figure 7:
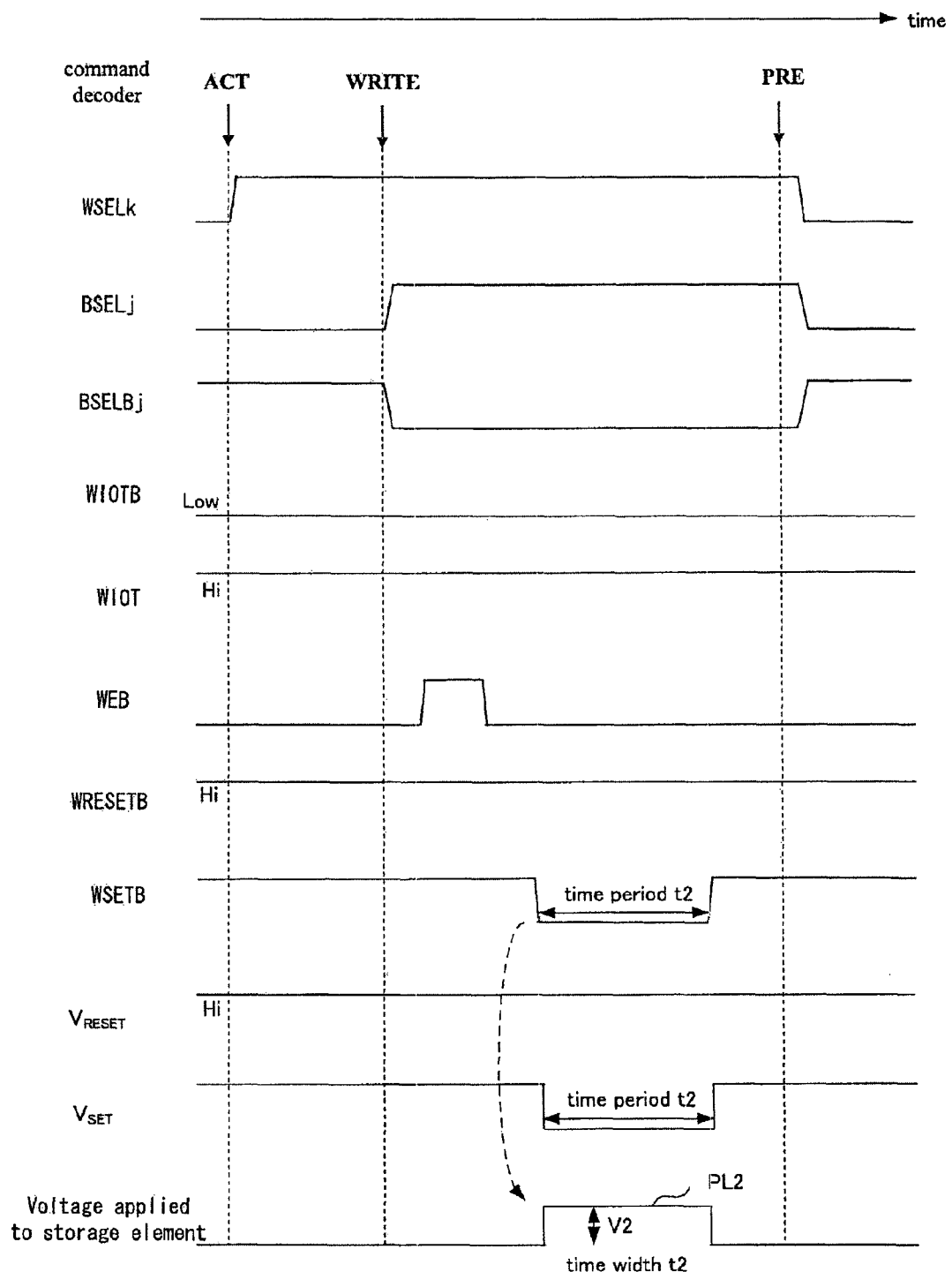
FIG. 7 is a diagram showing an exemplary timing chart of respective signals output from the respective components of the bit line control circuit and from the internal voltage generator circuit when a storage element is placed into a set state.

Referring next to FIG. 7, a description will be given of operations performed when storage element ME-k-j is placed into a "set state."

FIG. 7 is a timing chart of respective signals output from respective components of bit line control circuit BLC and internal voltage generator circuit 4 when storage element ME-k-j is placed into a set state after execution of the operations shown in FIG. 6.

As shown in FIG. 7, command decoder CMD_DC first receives input active command ACT.

Address decoder ADR_DC in turn receives and decodes a row address and a column address when active command ACT is input, outputs the column address to command decoder CMD_DC, and outputs word selection signal WSELk at High level to word line WLk corresponding to the row address. In this event, word selection signal WSELk at High level acts to simultaneously turn on memory cell transistors QM-k-0-QM-k-J which have the gates connected to word line WLk to which word selection signal WSELk at High level has been output.

Subsequently, upon receipt of write command WRITE and the column address from address decoder ADR_DC, command decoder CMD_DC outputs bit selection signal BSELj at High level, whose level is transitioned from Low level, to write circuit Yj connected to bit line BLj corresponding to the received column address. In this event, transistor Tj within write circuit Yj receives that bit selection signal BSELj at High level at its gate to conductively connect internal voltage generator circuit 4 with bit line BLj. Also, the inverter circuit within write circuit Yj inverts the level of bit selection signal BSELj from High to Low to generate signal BSELBj which is output to the gate of transistor Tj*. Consequently, transistor Tj* also conductively connects internal voltage generator circuit 4 with bit line BLj.

Further, after receiving write command WRITE, command decoder CMD_DC transitions write control signal WEB from Low to High, and outputs write control signal WEB at High level to the respective gates of transistors N1 and N3 for a predetermined time period. Consequently, transistor N4 which receives signal WIOT at High level at its gate, and transistor N3 which receives write control signal WEB at High level at its gate are both placed into ON state.

In this event, data held by the latch circuits are respectively inverted, so that High level is applied to one input terminal of OR circuit OR1, and Low level is applied to one input terminal of OR circuit OR2. Subsequently, even when command decoder CMD_DC transitions write control signal WEB from High to Low due to the lapse of the predetermined time period, the information is still held in the latch circuit.

In the state described above, command decoder CMD_DC transitions signal WSETB from High to Low, and outputs signal WSETB at Low level to OR circuit OR2 for time period t2.

Upon receipt of Low signals from the two input terminals, OR circuit OR2 transitions set operation signal $V_{SET}$ at the output side from High to Low, and applies set operation signal $V_{SET}$ at Low level to the gate of transistor Q2-2 for time period t2.

Transistor Q2-2 remains on for time period t2 during which it is receiving set operation signal $V_{SET}$ at Low level to conductively connect its source and drain.

Consequently, storage element ME-k-j is applied with write pulse PL2 which has voltage V2, reduced from voltage Vpp2 in accordance with the value of gate voltage $V_{REF}2$ applied to the gate of transistor Q1-2, and time width t2. Storage element ME-k-j is crystallized by a write current which flows in accordance with voltage V2 and resistance $R_{GST}$ of the GST film in storage element ME-k-j, placing storage element ME-k-j into a set state.

Notably, for time period t2 during which signal WSETB at Low level is output, OR circuit OR1 receives a High level from one input terminal, so that reset operation signal $V_{RESET}$ output from OR circuit OR1 remains fixed at High level irrespective of the potential of signal WRESETB.

Subsequently, upon receipt of precharge command PRE, command decoder CMD_DC outputs bit selection signal BSELj at Low level, transitioned from High level, to write circuit Yj. Command decoder CMD_DC also notifies address decoder ADR_DC of precharge command PRE received thereby. In response, address decoder ADR_DC transitions word selection signal WSELk from High to Low.

Notably, voltage V2 of write pulse PL2 for crystallizing the GST film is lower than voltage V1 of write pulse PL1 for amorphizing the GST film. Also, time period t2 during which write pulse PL2 is output at voltage V2 is longer than time period t1 during which write pulse PL1 is output at voltage V1. This is because, by applying relatively larger voltage V1 for relatively shorter time period t1, GST film is suddenly cooled down after being heated to temperatures higher than its melting point to amorphize. This is also because, by applying the GST film with write pulse PL2 of relatively lower voltage V2 for time period t2 that is longer than time period t1, the GST film is gradually cooled down after being heated to temperatures higher than its crystallization temperature but that are lower than its melting point to crystallize.

When information is read from each storage element ME-k-j, a current is applied through the GST film disposed between bit line BLj and ground terminal GND for a predetermined time period to measure the voltage drop of the bit line. As a result of the measurement, information representative of Low is determined when the resistance value of the GST film is low and the measured voltage drop is large, whereas information representative of High is determined when the resistance value of the GST film is high and the measured voltage drop is small.

Here, the state change between amorphization/crystallization is controlled by write pulses PL1, PL2, respectively, as previously described. If PL1, PL2 vary due to the influence of temperature and the like, a desired state change cannot be achieved, possibly leading to a failure to function as PRAM.

The internal voltage generator circuit in the present invention is applied to both amorphization/crystallization to achieve stable functions of PRAM.

As described above, according to the present invention, a write current supplied to each storage element ME-k-j within memory cell array ARY can be controlled without dependence on a process for manufacturing transistor Q1, fluctuations in a drive voltage for generating gate voltage $V_{REF}$, the temperature of transistor Q1, and the like.

It is apparent that the present invention is not limited to the above embodiments, but may be modified and changed without departing from the scope and spirit of the invention.

What is claimed is:

1. A semiconductor device comprising an internal voltage generator circuit said internal voltage generator circuit comprising:
   a first transistor having a first and a second main electrode and a control electrode;
   a control circuit controlling a voltage between said second main electrode and said control electrode of said first transistor such that a voltage at said first main electrode of said first transistor remains at a predetermined voltage;
   a second transistor having a first and a second main electrode and a control electrode, a voltage between said second main electrode and said control electrode of said first transistor being applied to between said second main electrode and said control electrode of said second transistor;

a load circuit connected to said first main electrode of said second transistor, wherein said second transistor is larger in current supply capability than said first transistor; and a switch disposed between said first main electrode of said second transistor and said load circuit, wherein a first and a second internal voltage generator circuits are provided as two of said internal voltage generator circuits, each of said first and said second internal voltage generator circuits having a variable resistor connected to said first main electrode of said first transistor, said load circuit is a storage element storing information corresponding to a High level or a Low level, and said variable resistor included in said first internal voltage generator circuit has a resistance value previously set such that said information corresponding to said High level can be stored in said storage element, and said variable resistor included in said second internal voltage generator circuit has a resistance value previously set such that said information corresponding to said Low level can be stored in said storage element.

2. The semiconductor device according to claim 1, further comprising a bit line control circuit receiving an arbitrary command from outside, wherein said first internal voltage generator circuit includes a reset control transistor, as a first switch, having a second main electrode connected to said first main electrode of said second transistor included in said first internal voltage generator circuit, a first main electrode connected to said storage element, and a control electrode connected to said bit line control circuit, said second internal voltage generator circuit includes a set control transistor, as a second switch, having a second main electrode connected to said first main electrode of said second transistor included in said second internal voltage generator circuit, a first main electrode connected to said storage element, and a control electrode connected to said bit line control circuit, said bit line control circuit applies a reset operation voltage to said control electrode of said reset control transistor upon receipt of an write command from outside for instructing a write operation of said information corresponding to said High level into said storage element, and applies a set operation voltage to said control electrode of said set control transistor upon receipt of a write command from outside for instructing a write operation of said information corresponding to Low level into said storage element, said reset control transistor, when applied with said reset operation voltage, reduces a voltage applied to said second main electrode of said second transistor included in said first internal voltage generator circuit in accordance with a voltage biased between said second main electrode and said control electrode of said second transistor to generate a first write voltage, and applies said first write voltage to said storage element, and said set control transistor, when applied with said set operation voltage, reduces a voltage applied to said second main electrode of said second transistor included in said second internal voltage generator circuit in accordance with a voltage biased between said second main electrode and said control electrode of said second transistor to generate a second write voltage, and applies said second write voltage to said storage element.

3. The semiconductor device according to claim 1, wherein a first voltage at said first main electrode of said first transistor included in said first internal voltage generator circuit, said first voltage being maintained by said control circuit included in said first internal voltage generator circuit, is higher than a second voltage at said first main electrode of said first transistor included in said second internal voltage generator circuit, said second voltage being maintained by said control circuit included in said second internal voltage generator circuit.

4. The semiconductor device according to claim 2, wherein a first voltage at said first main electrode of said first transistor included in said first internal voltage generator circuit, said first voltage being maintained by said control circuit included in said first internal voltage generator circuit, is higher than a second voltage at said first main electrode of said first transistor included in said second internal voltage generator circuit, said second voltage being maintained by said control circuit included in said second internal voltage generator circuit.

5. A semiconductor device comprising;
a first terminal;
a first internal voltage generator circuit which comprises a first transistor including a first control electrode and first and second main electrodes, a first control circuit controlling a first bias voltage across the first control electrode and the first main electrode of the first transistor such that the second main electrode of the first transistor maintains a first reference voltage, and a second transistor including a second control electrode and a third main electrode controlled by the first bias voltage thereacross and a fourth electrode from which a first internal voltage is derived;
a second internal voltage generator circuit which comprises a third transistor including a third control electrode and fifth and sixth main electrodes, a second control circuit controlling a second bias voltage across the third control electrode and the fifth main electrode of the third transistor such that the sixth main electrode of the third transistor maintains a second reference voltage, and a fourth transistor including fourth control electrode and a seventh main electrode controlled by the second bias voltage thereacross and an eighth electrode from which a second internal voltage is derived;
a first switch provided between the first terminal and the first internal voltage generator circuit to control supplying the first terminal with the first internal voltage;
a second switch provided between the first terminal and the second internal voltage generator circuit to control supplying the first terminal with the second internal voltage; and
a memory element electrically connected to the first terminal, the memory element being capable of storing either one of reset data and set data, wherein a potential of the first internal voltage is related to the reset data, and a potential of the second internal voltage is related to the set data.

6. The semiconductor device according to claim 5, further comprising a control circuit controlling the first and second switches such that the first switch is shorter in activated period than the second switch.

7. The semiconductor device as claimed in claim 5, wherein the memory element changes to be a reset state when supplied with the first internal voltage, changing to be a set state when supplied with the second internal voltage, and the reset state being different in resistance value from the set state.

8. The semiconductor device as claimed in claim 7, wherein the reset state is greater in resistance value than the set state.

9. A semiconductor device comprising:
   a terminal;
   a first internal voltage generator which comprises a first transistor including a first control electrode and first and second main electrodes, a first control circuit controlling a first bias voltage across the first control electrode and the first main electrode of the first transistor such that the second main electrode of the first transistor maintains a first reference voltage, and a second transistor including a second control electrode and a third main electrode controlled by the first bias voltage thereacross and a fourth main electrode from which a first internal voltage is derived;
   a second internal voltage generator which comprises a third transistor including a third control electrode and fifth and sixth main electrodes, a second control circuit controlling a second bias voltage across the third control electrode and the fifth main electrode of the third transistor such that the sixth main electrode of the third transistor maintains a second reference voltage which is different from the first reference voltage, and a fourth transistor including fourth control electrode and a seventh main electrode controlled by the second bias voltage thereacross and an eight main electrode from which a second internal voltage is derived, the second internal voltage being different from the first internal voltage;
   a first switch provided to control supplying the terminal with the first internal voltage; and
   a second switch provided to control supplying the terminal with the second internal voltage.

10. The semiconductor device according to claim 9, further comprising a memory element coupled to the terminal.

11. The semiconductor device according to claim 10, wherein the memory element changes to be a reset state when supplied with the first internal voltage, changing to be a set state when supplied with the second internal voltage, and the reset state being different in resistance value from the set state.

12. The semiconductor device as claimed in claim 11, wherein the reset state is greater in resistance value than the set state.

13. The semiconductor device as claimed in claim 9, further comprising a control circuit controlling the first and second switches such that the first switch is shorter in activated period than the second switch.

14. The semiconductor device as claimed in claim 9, wherein the first switch is provided between the first internal voltage generator and the terminal and the second switch is provided between the second internal voltage generator and the terminal.

* * * * *